US009673365B2

(12) United States Patent
Haushalter et al.

(10) Patent No.: US 9,673,365 B2
(45) Date of Patent: Jun. 6, 2017

(54) OPTOELECTRONIC COMPONENT AND ELECTRONIC DEVICE HAVING AN OPTOELECTRONIC COMPONENT

(71) Applicant: OSRAM Opto Semiconductors GmbH, Regensburg (DE)

(72) Inventors: Martin Haushalter, Regensburg (DE); David O'Brien, Bad Abbach (DE)

(73) Assignee: OSRAM Opto Semiconductors GmbH (DE)

( * ) Notice: Subject to any disclaimer, the term of this patent is extended or adjusted under 35 U.S.C. 154(b) by 4 days.

(21) Appl. No.: 14/771,850

(22) PCT Filed: Mar. 5, 2014

(86) PCT No.: PCT/EP2014/054208
§ 371 (c)(1),
(2) Date: Sep. 1, 2015

(87) PCT Pub. No.: WO2014/135560
PCT Pub. Date: Sep. 12, 2014

(65) Prior Publication Data
US 2016/0027979 A1    Jan. 28, 2016

(30) Foreign Application Priority Data
Mar. 5, 2013    (DE) .................... 10 2013 203 759

(51) Int. Cl.
*H01L 33/62*    (2010.01)
*H01L 33/48*    (2010.01)
(Continued)

(52) U.S. Cl.
CPC ............... *H01L 33/62* (2013.01); *F21K 9/20* (2016.08); *H01L 33/486* (2013.01); *H05K 1/182* (2013.01);
(Continued)

(58) Field of Classification Search
CPC ......... H01L 33/62; H01L 33/486; F21K 9/20; H05K 1/182; H05K 3/3442
See application file for complete search history.

(56) References Cited

U.S. PATENT DOCUMENTS

| 5,331,512 A | 7/1994 | Orton |
| 2008/0230790 A1 | 9/2008 | Seko et al. |

(Continued)

FOREIGN PATENT DOCUMENTS

| DE | 10 2010 023 955 A1 | 12/2011 |
| EP | 2 346 100 A2 | 7/2011 |

(Continued)

OTHER PUBLICATIONS

English translation of Notice of Reasons for Rejection dated Jun. 28, 2016, from corresponding Japanese Patent Application No. 2015-560669.

(Continued)

*Primary Examiner* — Mary Ellen Bowman
(74) *Attorney, Agent, or Firm* — DLA Piper LLP (US)

(57) ABSTRACT

An electronic device includes a printed circuit board having a cutout, wherein an optoelectronic component including a housing having an outer surface, the housing has a chip receptacle space at a top side, an optoelectronic semiconductor chip is arranged in the chip receptacle space, the housing has a first soldering contact surface and a second soldering contact surface, the first soldering contact surface and the second soldering contact surface face in the same spatial direction as the outer surface, and the first soldering contact surface and the second soldering contact surface are set back relative to the outer surface, is arranged in the cutout.

11 Claims, 4 Drawing Sheets

(51) Int. Cl.
    *H05K 1/18*   (2006.01)
    *H05K 3/34*   (2006.01)
    *F21K 9/20*   (2016.01)
    *H05K 1/14*   (2006.01)

(52) U.S. Cl.
    CPC .. H05K 3/3442 (2013.01); *H01L 2224/48091* (2013.01); *H01L 2224/48247* (2013.01); *H05K 1/141* (2013.01); *H05K 1/142* (2013.01); *H05K 2201/049* (2013.01); *H05K 2201/09072* (2013.01); *H05K 2201/09954* (2013.01); *H05K 2201/10106* (2013.01); *Y02P 70/613* (2015.11)

(56) References Cited

U.S. PATENT DOCUMENTS

| 2009/0289272 | A1* | 11/2009 | Kim ............... H01L 33/486 257/98 |
| 2009/0315068 | A1 | 12/2009 | Oshio et al. |
| 2013/0200411 | A1 | 8/2013 | O'Brien et al. |

FOREIGN PATENT DOCUMENTS

| JP | 2-105112 | 4/1990 |
| JP | 2-109010 | 4/1990 |
| JP | 6-53258 | 2/1994 |
| JP | 2008-147605 | 6/2008 |

OTHER PUBLICATIONS

Chinese Office Action dated Jan. 18, 2017, of corresponding Chinese Application No. 201480025436.4 in English.

\* cited by examiner

OPTOELECTRONIC COMPONENT AND ELECTRONIC DEVICE HAVING AN OPTOELECTRONIC COMPONENT

TECHNICAL FIELD

This disclosure relates to an optoelectronic component and an electronic device having an optoelectronic component.

German priority application DE 10 2013 203 759.7, which expressly forms part of this disclosure, describes an optoelectronic component and an electronic device having an optoelectronic component.

BACKGROUND

Optoelectronic components, for example, light emitting diode components, are known. For numerous applications it is necessary to form optoelectronic components having housings that save as much space as possible. Such optoelectronic components are often formed as SMT components that are arranged on a printed circuit board of an electronic device according to a method of surface mounting. The housings of such optoelectronic components have to have a certain minimum size such that the optoelectronic component can have desired optical properties. The minimum size of an optoelectronic component governs a minimum height of a structural space required to mount the optoelectronic component above a printed circuit board. Limits are thereby imposed on a possible miniaturization of an electronic device having the printed circuit board.

It could therefore be helpful to provide an optoelectronic component.

SUMMARY

We provide an optoelectronic component including a housing having a top side, an underside, a first end side, a second end side and an outer surface, wherein the housing has a chip receptacle space at the top side, an optoelectronic semiconductor chip arranged in the chip receptacle space, the first end side and the second end side each extend in an upward direction between the underside and the top side, a protruding first contact web is formed at the first end side and a protruding second contact web is formed at the second end side, the first contact web and the second contact web, in a direction transverse perpendicularly oriented to the upward direction, have a smaller width than the first end side and the second end side, the housing has a first soldering contact surface, a second soldering contact surface, a third soldering contact surface and a fourth soldering contact surface, the first soldering contact surface and the second soldering contact surface face in a same spatial direction as the outer surface, the first soldering contact and the second soldering contact surface are set back relative to the outer surface, the third soldering contact surface and the fourth soldering contact surface face in the same spatial direction as the underside, the third soldering contact surface and the fourth soldering contact surface are set back relative to the underside, the first soldering contact surface is formed by a first metallization arranged at the first contact web at the surface of the housing, the second soldering contact surface is formed by a second metallization arranged at the second contact web at the surface of the housing, and the housing includes an electrically insulating plastic material and is coated with the metallizations in sections.

We also provide an electronic device including a printed circuit board having a cutout, wherein the optoelectronic component including a housing having a top side, an underside, a first end side, a second end side and an outer surface, wherein the housing has a chip receptacle space at the top side, an optoelectronic semiconductor chip arranged in the chip receptacle space, the first end side and the second end side each extend in an upward direction between the underside and the top side, a protruding first contact web is formed at the first end side and a protruding second contact web is formed at the second end side, the first contact web and the second contact web, in a direction transverse perpendicularly oriented to the upward direction, have a smaller width than the first end side and the second end side, the housing has a first soldering contact surface, a second soldering contact surface, a third soldering contact surface and a fourth soldering contact surface, the first soldering contact surface and the second soldering contact surface face in a same spatial direction as the outer surface, the first soldering contact and the second soldering contact surface are set back relative to the outer surface, the third soldering contact surface and the fourth soldering contact surface face in the same spatial direction as the underside, the third soldering contact surface and the fourth soldering contact surface are set back relative to the underside, the first soldering contact surface is formed by a first metallization arranged at the first contact web at the surface of the housing, the second soldering contact surface is formed by a second metallization arranged at the second contact web at the surface of the housing, and the housing includes an electrically insulating plastic material and is coated with the metallizations in sections, is arranged in the cutout.

LIST OF REFERENCE SIGNS

Figure 1:
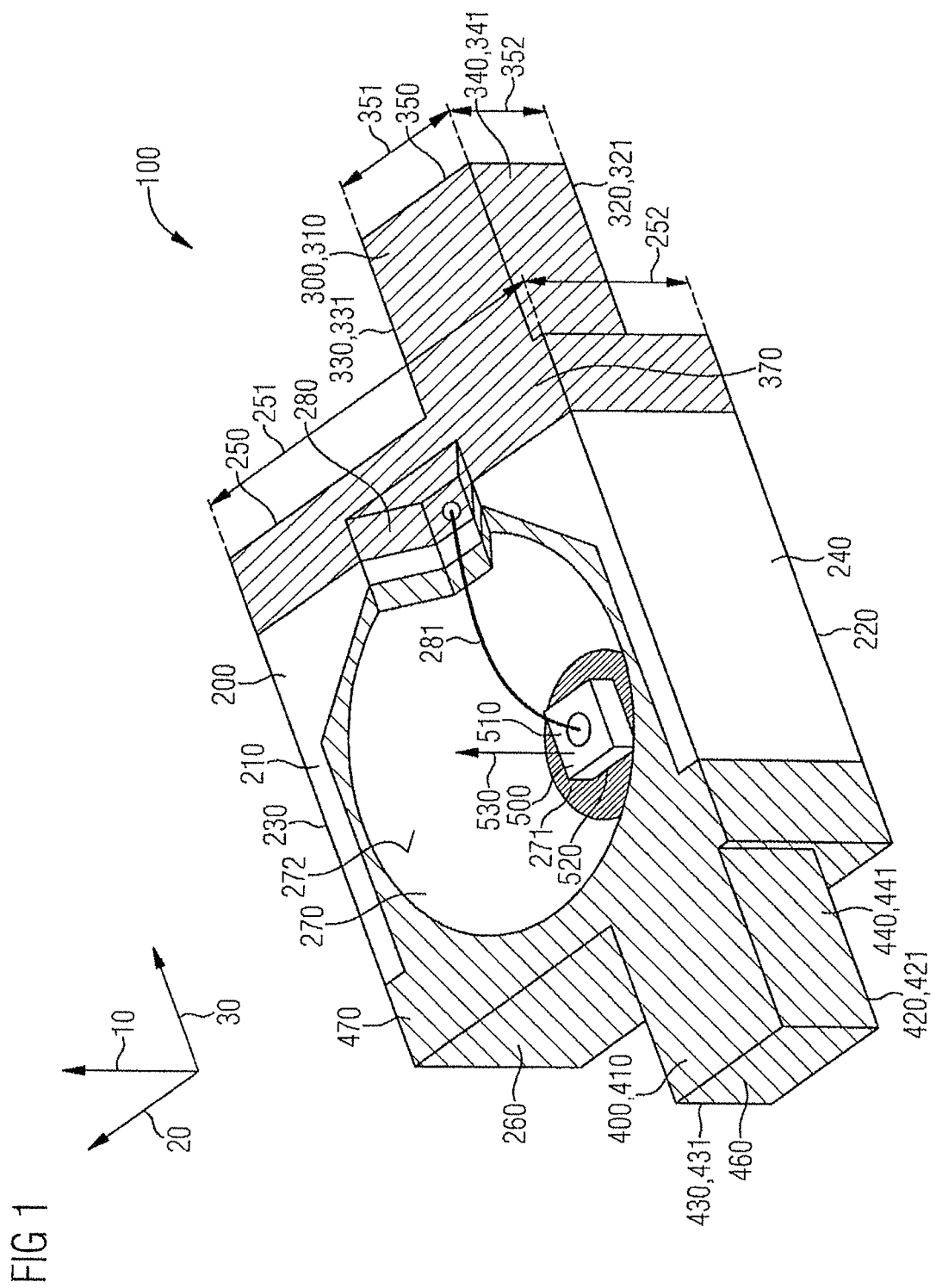
FIG. 1 shows a perspective illustration of an optoelectronic component.

10 Upward direction
20 Transverse direction
30 Longitudinal direction
100 Optoelectronic component
110 First electronic device
120 Second electronic device
130 Third electronic device
200 Housing
210 Top side
220 Underside
230 First side surface
240 Second side surface
250 First end side
251 Width
252 Height
260 Second end side
270 Chip receptacle space
271 Base region 272 Side wall
280 Bonding contact space
281 Bonding wire
300 First contact web
310 First outer top side
320 First outer underside
321 First lower soldering contact surface
330 First inner side surface
331 First lateral soldering contact surface
340 First outer side surface
341 First outer soldering contact surface
350 First outer end side
351 Width
352 Height
370 First metallization
400 Second contact web
410 Second outer top side
420 Second outer underside
421 Second lower soldering contact surface
430 Second inner side surface
431 Second lateral soldering contact surface
440 Second outer side surface
441 Second outer soldering contact surface
460 Second outer end side
470 Second metallization
500 Optoelectronic semiconductor chip
510 Top side
520 Underside
530 Emission direction
600 Printed circuit board
610 Top side
611 First soldering surface
612 Second soldering surface
613 Solder
620 Underside
630 Cutout

DETAILED DESCRIPTION

Our optoelectronic component comprises a housing having an outer surface. The housing has a chip receptacle space at a top side, an optoelectronic semiconductor chip being arranged in the chip receptacle space. The housing additionally has a first soldering contact surface and a second soldering contact surface. The first soldering contact surface and the second soldering contact surface face in the same spatial direction as the outer surface. In this case, the first soldering contact surface and the second soldering contact surface are set back relative to the outer surface. Advantageously, this optoelectronic component can be arranged in a cutout of a printed circuit board of an electronic device, thereby reducing the structural space required for the optoelectronic component above the printed circuit board and below the printed circuit board. In this case, the first soldering contact surface and the second soldering contact surface can electrically contact soldering surfaces arranged at a top side of the printed circuit board. The optoelectronic component can be mounted, for example, according to a method of surface mounting, for instance by reflow soldering.

The first soldering contact surface may be formed by a first metallization arranged at the surface of the housing. Moreover, the second soldering contact surface may be formed by a second metallization arranged at the surface of the housing. This enables the housing of the optoelectronic component to be produced by a method of MID technology. This advantageously results in a great freedom in the geometrical design of the housing of the optoelectronic component.

The housing may comprise an electrically insulating material, for example, a plastic material. In this case, the housing is coated with the metallizations in sections. Advantageously, the housing of the optoelectronic component can be produced cost-effectively by an injection-molding method, for example, and subsequently coated. The optoelectronic component can thus be produced by an MID method, for example. All electrically conductive structures of the optoelectronic component can thus be arranged completely at the surface of the housing.

The housing may have an underside, a first end side and a second end side. The first end side and the second end side extend in an upward direction between the underside and the top side. A protruding first contact web is formed at the first end side. A protruding second contact web is formed at the second end side. The first contact web and the second contact web, in a transverse direction oriented perpendicularly to the upward direction, have a smaller width than the first end side and the second end side. The first soldering contact surface is formed at the first contact web. The second soldering contact surface is formed at the second contact web. The soldering contact surfaces can be metallizations arranged superficially on a plastic structure. Advantageously, this optoelectronic component can be supported by its contact webs at the edge of a cutout of a printed circuit board, while a more voluminous part of the housing of this optoelectronic component is arranged in the cutout of the printed circuit board in a space-saving manner. In this case, the contact webs can advantageously serve simultaneously for the electrical contacting of the optoelectronic component.

The first contact web and the second contact web may be arranged at the first end side and at the second end side in an uncentered fashion in the transverse direction. This advantageously enables a significant proportion of the housing of the optoelectronic component to be arranged in a cutout of a printed circuit board below a level of a top side of the printed circuit board, while the first contact web and the second contact web of the optoelectronic component are arranged above the top side of the printed circuit board and are electrically contacted there.

The first contact web and the second contact web may be at most half as wide as the first end side and the second end side in the transverse direction. This advantageously enables the major portion of the housing of the optoelectronic component to be arranged substantially symmetrically between a top side and an underside of a printed circuit board in a cutout of the printed circuit board. The structural space required for the optoelectronic component on both sides of the printed circuit board is advantageously minimized as a result.

The chip receptacle space may be formed as a substantially funnel-shaped depression. Advantageously, the optoelectronic semiconductor chip arranged in the chip receptacle space is thereby protected against mechanical damage. Moreover, the funnel-shaped depression of the chip receptacle space can advantageously bring about beam focusing of electromagnetic radiation emitted by the optoelectronic semiconductor chip.

The first metallization may extend over all outer surfaces of the first contact web. Alternatively or additionally, the second metallization can extend over all outer surfaces of the second contact web. The plastic structure of the contact webs can be completely covered with the metallization.

Advantageously, a solder during an electrical contacting of the optoelectronic component, as a result, can also wet and electrically contact further outer surfaces of the contact webs besides the lateral soldering contact surfaces, as a result of which a low-impedance and reliable electrically conductive connection to the optoelectronic component can be ensured.

The optoelectronic semiconductor chip may electrically conductively connect to the first metallization by a bonding wire. Advantageously, the electrically conductive connection is thereby producible simply and in an automated manner.

The second metallization may form an optical reflector in the region of the chip receptacle space. Advantageously, the optoelectronic component can thereby achieve a high luminous efficiency. By virtue of the double function of the second metallization as optical reflector and as electrical conductor, the optoelectronic component is advantageously producible particularly simply and cost-effectively.

The housing additionally may have a third soldering contact surface and a fourth soldering contact surface. The third soldering contact surface and the fourth soldering contact surface face in the same spatial direction as the underside. The third soldering contact surface and the fourth soldering contact surface are set back relative to the underside. Advantageously, the optoelectronic component can thereby also be arranged in a cutout of a printed circuit board such that the third soldering contact surface and the fourth soldering contact surface face a top side of the printed circuit board and connect to soldering surfaces of the printed circuit board by soldering connections. In this case, a voluminous part of the housing of the optoelectronic component is arranged in the cutout of the printed circuit board in a space-saving manner, thereby reducing the structural space required for the optoelectronic component above and below the printed circuit board.

In an arrangement of the optoelectronic component in which the third soldering contact surface and the fourth soldering contact surface face the top side of the printed circuit board, the housing and the optoelectronic semiconductor chip arranged in the chip receptacle space of the housing of the optoelectronic component are rotated by 90° with respect to an arrangement of the optoelectronic component in which the first soldering contact surface and the second soldering contact surface of the housing of the optoelectronic component face the top side of the printed circuit board. Consequently, an emission direction of the optoelectronic component also differs by 90° in the two arrangements of the optoelectronic component. The optoelectronic component can advantageously thus be mounted both in a top view arrangement in which an emission direction is oriented perpendicularly to a top side of a printed circuit board and in a side view arrangement in which the emission direction of the optoelectronic component is oriented parallel to the top side of the printed circuit board.

The first contact web and the second contact web may have a smaller height than the first end side and the second end side in the upward direction. In this case, the third soldering contact surface is formed at the first contact web. The fourth soldering contact surface is formed at the second contact web. Advantageously, the optoelectronic component can thereby be arranged in a cutout of a printed circuit board such that the contact webs of the housing of the optoelectronic component are supported at an edge of the cutout and the third soldering contact surface and the fourth soldering contact surface of the optoelectronic component are in contact with soldering surfaces of the printed circuit board, while a more voluminous housing part of the optoelectronic component between the first contact web and the second contact web is arranged in the cutout of the printed circuit board in a space-saving manner.

The first contact web and the second contact web may be arranged at the first end side and the second end side in an uncentered fashion in the upward direction. Advantageously, as a result, a major proportion of the volume of the housing of the optoelectronic component can be arranged below a level of a top side of a printed circuit board in a cutout of a printed circuit board, while the first contact web and the second contact web of the housing of the optoelectronic component are arranged above the top side of the printed circuit board and the third and fourth soldering contact surfaces of the optoelectronic component face the top side of the printed circuit board.

The first contact web and the second contact web may be at most half as high as the first end side and the second end side in the upward direction. This advantageously enables an arrangement of the optoelectronic component in a cutout of a printed circuit board in which the volume of the optoelectronic component is arranged approximately symmetrically between a top side and an underside of the printed circuit board in the cutout of the printed circuit board. As a result, the structural space required for the optoelectronic component on both sides of the printed circuit board is advantageously minimized.

An electronic device comprises a printed circuit board having a cutout. In this case, an optoelectronic component of the type described is arranged in the cutout. Advantageously, the optoelectronic component in this electronic device requires a very small structural space above and below the printed circuit board. As a result, the electronic device can advantageously be formed particularly compactly.

The above-described properties, features and advantages and also the way in which they are achieved will become clearer and more clearly understood in association with the following description of the examples which are explained in greater detail in association with the drawings.

FIG. 1 shows a slightly schematic perspective illustration of an optoelectronic component 100. The optoelectronic component 100 can be a light emitting diode component, for example.

The optoelectronic component 100 comprises a housing 200. The housing 200 comprises an electrically insulating material and is coated with an electrically conductive material in sections. The electrically insulating material is preferably a plastic material. The housing 200 of the optoelectronic component 100 can be produced, for example, according to a method of MID technology.

The housing 200 of the optoelectronic component 100 comprises a substantially parallelepipedal main body having a top side 210, an underside 220 opposite the top side 210, a first side surface 230, a second side surface 240 opposite the first side surface 230, a first end side 250 and a second end side 260 opposite the first end side 250. The top side 210 of the housing 200 is arranged above the underside 220 in an upward direction 10. The first side surface 230 and the second side surface 240 extend between the underside 220 and the top side 210 in the upward direction 10. Moreover, the first side surface 230 and the second side surface 240 extend in a longitudinal direction 30, perpendicular to the upward direction 10, between the second end side 260 and the first end side 250. The first end side 250 and the second end side 260 extend in the upward direction 10 between the underside 220 and the top side 210 of the housing 200. Moreover, the first end side 250 and the second end side 260 extend in a transverse direction 20, perpendicular to the upward direction 10 and to the longitudinal direction 30, between the second side surface 240 and the first side surface 230. Consequently, the upward direction 10 is oriented perpendicularly to the top side 210. The transverse direction 20 is oriented perpendicularly to the first side surface 230. The longitudinal direction 30 is oriented perpendicularly to the first end side 250.

In the transverse direction 20, the first end side 250 and the second end side 260 in each case have a width 251. In the upward direction 10, the first end side 250 and the second end side 260 in each case have a height 252.

The first side surface 230 and the second side surface 240 of the housing 200 can be sawing surfaces along which the housing 200 was separated from further housings of the same type during its production.

A first contact web 300 is formed at the first end side 250 of the housing 200 of the optoelectronic component 10. The first contact web 300 has an approximately square basic shape and is oriented perpendicularly to the first end side 250 of the housing 200. Outer edges and outer surfaces of the first contact web 300 run substantially parallel to outer edges and outer surfaces of the approximately parallelepipedal main body of the housing 200. The first contact web 300 comprises a plastic structure formed integrally with the main body of the housing 200. A metallization explained in greater detail below is arranged at the surface of the plastic structure.

The first contact web 300 has a first outer top side 310 and a first outer underside 320 opposite the first outer top side 310. Furthermore, the first contact web 300 has a first inner side surface 330 and a first outer side surface 340 opposite the first inner side surface 330. Moreover, the first contact web 300 has a first outer end side 350. The first outer top side 310 is oriented parallel to the top side 210 of the approximately parallelepipedal main body of the housing 200 and faces in the upward direction 10 like the top side. The first outer underside 320 is oriented parallel to the underside 220 of the housing 200 in a spatial direction opposite to the upward direction 10. The first inner side surface 330 of the first contact web 300 is oriented parallel to the first side surface 230 of the housing 200 and faces in the transverse direction 20. The first outer side surface 340 is oriented parallel to the second side surface 240 of the housing 200 in a spatial direction opposite to the transverse direction 20. The first outer end side 350, like the first end side 250 of the housing 200, faces in the longitudinal direction 30.

In the transverse direction 20, the first outer end side 350 of the first contact web 300 has a width 351 that is less than the width 251 of the first end side 250 of the housing 200. In the upward direction 10, the first outer end side 350 of the first contact web 300 has a height 352 that is less than the height 252 of the first end side 250 of the housing 200. Preferably, the width 351 of the first outer end side 350 of the first contact web 300 is less than half of the width 251 of the first end side 250 of the housing 200. The height 352 of the first outer end side 350 of the first contact web 300 is also preferably less than half of the height 252 of the first end side 250 of the housing 200. Consequently, the first contact web 300 covers only a portion of the first end side 250 of the housing 200, preferably less than one quarter of the first end side 250 of the housing 200.

The first contact web 300 is preferably arranged at the first end side 250 of the housing 200 in a centered fashion neither in the upward direction 10 nor in the transverse direction 20. In the example illustrated in FIG. 1, the first outer top side 310 of the first contact web 300 is adjacent to the top side 210 of the housing 200 in a flush fashion. The first outer underside 320 is set back relative to the underside 220 of the housing 200 in the upward direction 10. The first outer side surface 340 of the first contact web 300 is set back slightly relative to the second side surface 240 of the housing 200 in the transverse direction 20. However, the first outer side surface 340 could also be adjacent to the second side surface 240 of the housing 200 in a flush fashion. The first inner side surface 330 is distinctly set back relative to the first side surface 230 in the transverse direction 20.

A second contact web 400 is formed at the second end side 260 of the parallelepipedal main body of the housing 200 of the optoelectronic component 100. The second contact web 400 is formed substantially mirror-symmetrically with respect to the first contact web 300. The second contact web 400 comprises a plastic structure formed integrally with the main body of the housing 200. A metallization explained in greater detail below is arranged at the surface of the plastic structure.

The second contact web 400 has a second outer top side 410 and a second outer underside 420 opposite the second outer top side 410. Furthermore, the second contact web 400 has a second inner side surface 430 and a second outer side surface 440 opposite the second inner side surface 430. Moreover, the second contact web 400 has a second outer end side 460. The second outer top side 410 is oriented like the first outer top side 310 of the first contact web 300. The second outer underside 420 of the second contact web 400 is oriented like the first outer underside 320 of the first contact web 300. The second inner side surface 430 of the second contact web 400 is oriented like the first inner side surface 330 of the first contact web 300. The second outer side surface 440 is oriented like the first outer side surface 340 of the first contact web 300. The second outer end side 460 is oriented parallel to the second end side 260 of the approximately parallelepipedal main body of the housing 200 and, like the end side, faces in a spatial direction opposite to the longitudinal direction 30.

The second outer end side 460 has the same width 351 as the first outer end side 350 of the first contact web 300. Moreover, the second outer end side 460 of the second contact web 400 has the same height 352 as the first outer end side 350 of the first contact web 300. The second outer underside 420 of the second contact web 400, like the first outer underside 320 of the first contact web 300, is set back relative to the underside 220 of the housing 200 in the upward direction 10. The second inner side surface 430 of the second contact web 400, like the first inner side surface 330 of the first contact web 300, is set back relative to the first side surface 230 of the housing 200 in the transverse direction 20.

A chip receptacle space 270 is formed at the top side 210 of the housing 200. The chip receptacle space 270 extends from the top side 210 of the housing 200 into the housing 200. In this case, the chip receptacle space 270 tapers in a funnel-shaped fashion. In the example illustrated, the chip receptacle space 270 has a frustoconical shape whose circular-disk-shaped cross section decreases from the top side 210 of the housing 200 into the housing 200. The chip receptacle space 270 has a base region 271 that forms a top surface of the frustoconical chip receptacle space 270. A side wall 272 forms a lateral surface of the frustoconical chip receptacle space 270.

Furthermore, a bonding contact space 280 is formed at the top side 210 of the housing 200 of the optoelectronic component 100. The bonding contact space 280 is formed by a depression at the top side 210 of the housing 200 which adjoins the chip receptacle space 270. In the example illustrated, the depth of the depression forming the bonding contact space 280 does not extend to the depth of the chip receptacle space 270. However, the bonding contact space 280 can also be formed differently than is illustrated.

The housing 200 of the optoelectronic component 100 has electrically conductive coatings that form a first metallization 370 and a second metallization 470. The first metallization 370 and the second metallization 470 may have been arranged at the outer surfaces of the housing 200, for example, according to a method of MID technology. The first metallization 370 and the second metallization 470 each form continuous electrically conductive surfaces. The first metallization 370 and the second metallization 470 are electrically insulated from one another.

The second metallization 470 covers the side wall 272 and the base region 271 of the chip receptacle space 270, the second outer underside 420 of the second contact web 400, the second inner side surface 430 of the second contact web 400 and the second outer side surface 440 of the second contact web 400. At the second outer underside 420 of the second contact web 400, the second metallization 470 forms a second lower soldering contact surface 421. At the second inner side surface 430 of the second contact web 400, the second metallization 470 forms a second lateral soldering contact surface 431. At the second outer side surface 440 of the second contact web 400, the second metallization 470 forms a second outer soldering contact surface 441.

The second metallization 470 can cover even further parts of the surface of the housing 200 of the optoelectronic component 100. In the example illustrated, the second metallization 470 covers, for example, the second end side 260 of the housing 200, a portion of the top side 210 of the housing 200, a portion of the first side surface 230 of the housing 200, a portion of the second side surface 240 of the housing 200 and a portion of the underside 220 of the housing 200. Moreover, the second metallization 470 also covers the second outer top side 410 of the second contact web 400 and the second outer end side 460 of the second outer contact web 400. The second outer contact web 400 is thus completely covered by the second metallization 470.

The first metallization 370 covers a portion of the bonding contact space 280 of the housing 200, the first outer underside 320 of the first contact web 300, the first inner side surface 330 of the first contact web 300 and the first outer side surface 340 of the first contact web 300. In the region of the first outer underside 320 of the first contact web 300, the first metallization 370 forms a first lower soldering contact surface 321. In the region of the first inner side surface 330 of the first contact web 300, the first metallization 370 forms a first lateral soldering contact surface 331. In the region of the first outer side surface 340 of the first contact web 300, the first metallization 370 forms a first outer soldering contact surface 341.

The first metallization 370 can cover even further parts of the surface of the housing 200 of the optoelectronic component 100. In the example illustrated, the first metallization 370 additionally covers a portion of the top side 210 of the housing 200, a portion of the first side surface 230 of the housing 200, a portion of the second side surface 240 of the housing 200, a portion of the underside 220 of the housing 200 and the first end side 250 of the housing 200. Moreover, the first metallization 370 covers the first outer top side 310 of the first contact web 300 and the first outer end side 350 of the first contact web 300. The first contact web 300 is thus completely covered by the first metallization 370.

An optoelectronic semiconductor chip 500 is arranged in the chip receptacle space 270 of the housing 200 of the optoelectronic component 100. The optoelectronic semiconductor chip 500 can be a light emitting diode chip (LED chip), for example. The optoelectronic semiconductor chip 500 has a top side 510 and an underside 520 opposite the top side 510. A respective electrical contact for the electrical contacting of the optoelectronic semiconductor chip 500 are arranged at the top side 510 and the underside 520 of the optoelectronic semiconductor chip 500. The optoelectronic semiconductor chip 500 is designed to emit electromagnetic radiation in an emission direction 530 oriented perpendicularly to the top side 510 of the optoelectronic semiconductor chip 500 if an electrical voltage is applied to the optoelectronic semiconductor chip 500 via the electrical contacts thereof.

The optoelectronic semiconductor chip 500 is arranged in the base region 210 of the chip receptacle space 270 of the housing 200 in such a way that the underside 520 of the optoelectronic semiconductor chip 500 faces the base region 271. In this case, the electrical contact arranged at the underside 520 of the optoelectronic semiconductor chip 500 electrically conductively connects to the second metallization 470 arranged in the base region 271 of the chip receptacle space 270 of the housing 200. A bonding wire 281 extends between the electrical contact—arranged at the top side 510 of the optoelectronic semiconductor chip 500—of the optoelectronic semiconductor chip 500 and the bonding contact space 280, the bonding wire electrically conductively connecting the electrical contact arranged at the top side 510 of the optoelectronic semiconductor chip 500 to the first metallization 370.

By the arrangement of the optoelectronic semiconductor chip 500 at the base region 271 of the chip receptacle space 270 of the housing 200, the emission direction 530 of the optoelectronic semiconductor chip 500 is oriented approximately parallel to the upward direction 10. That portion of the second metallization 470 which is arranged at the side wall 272 of the chip receptacle space 270 can serve as a reflector for electromagnetic radiation emitted by the optoelectronic semiconductor chip 500. Electromagnetic radiation emitted obliquely with respect to the upward direction 10 by the optoelectronic semiconductor chip 500 can be reflected at the second metallization 470 in the region of the side wall 272 of the chip receptacle space 270 and can thereby be focused approximately in the emission direction 530. This beam focusing is supported by the frustoconical shape of the chip receptacle space 270.

Figure 2:
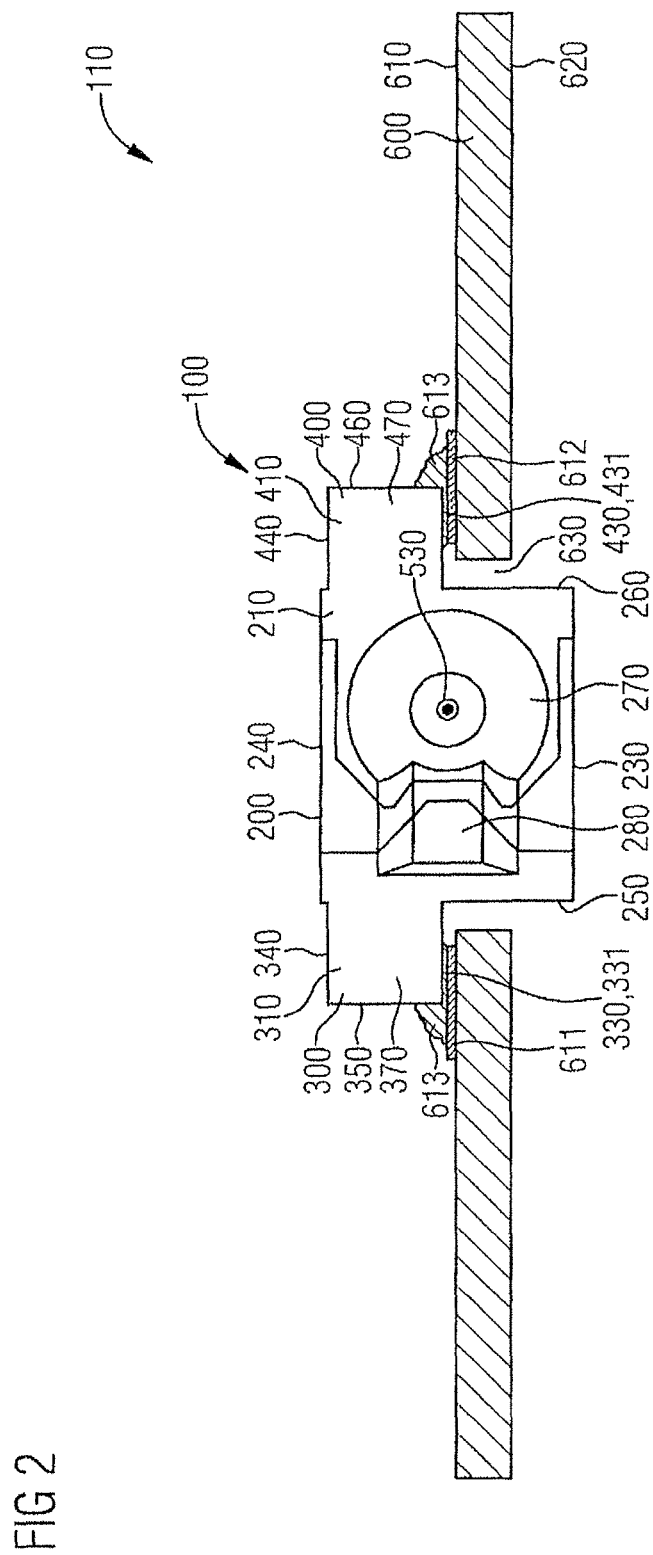
FIG. 2 shows a side view of a first electronic device including the optoelectronic component in a first arrangement.

FIG. 2 shows a slightly schematic illustration of a first electronic device 110. Not all parts of the first electronic device 110 are illustrated in FIG. 2. The first electronic device 110 can be, for example, an electronic device having compact outer dimensions and therefore structural space available only to a limited extent. The first electronic device 110 comprises the optoelectronic component 100 from FIG. 1.

The first electronic device 110 comprises a printed circuit board 600. The printed circuit board 600 can also be designated as a circuit board. The printed circuit board 600 is illustrated in a sectional side view in FIG. 2. The printed circuit board 600 has a top side 610 and an underside 620 opposite the top side 610. The printed circuit board 600 furthermore has a cutout 630, which forms a perforation between the top side 610 and the underside 620. At the top side 610 of the printed circuit board 600, a first soldering surface 611 and a second soldering surface 612 are arranged on two opposite sides of the cutout 630. Even further soldering surfaces and conductor tracks can be present at the top side 610, these not being shown in FIG. 2.

The optoelectronic component 100 is illustrated in a slightly simplified manner in FIG. 2 without the optoelectronic semiconductor chip 500 and the bonding wire 281. The optoelectronic component 100 is arranged in the region of the cutout 630 of the printed circuit board 600 in such a way that the first side surface 230 of the housing 200 of the optoelectronic component 100 faces in the same spatial direction as the underside 620 of the printed circuit board 600. The second side surface 240 of the housing 200 faces in the same spatial direction as the top side 610 of the printed circuit board 600. As a result, the top side 210 of the housing 200 of the optoelectronic component 100 is oriented perpendicularly to the top side 610 of the printed circuit board 600. The emission direction 530 of the optoelectronic semiconductor chip 500 of the optoelectronic component 100 thus runs parallel to the top side 610 of the printed circuit board 600. The orientation of the optoelectronic component 100 with respect to the printed circuit board 600 of the first electronic device 110, as shown in FIG. 2, can be designated as a side view arrangement.

The approximately parallelepipedal main body of the housing 200 of the optoelectronic component 110 is arranged in the region of the cutout 630 in such a way that the first end side 250 and the second end side 260 of the housing 200 of the optoelectronic component 110 in each case face a side edge of the cutout 630. The second side surface 240 of the housing 200 is arranged above the top side 610 of the printed circuit board 600. The first side surface 230 of the housing 200 is arranged below the underside 620 of the printed circuit board 600.

The first contact web 300 and the second contact web 400 of the housing 200 of the optoelectronic component 100 are supported on the top side 610 of the printed circuit board 600. In this case, the first inner side surface 330 with the first lateral soldering contact surface 331 of the first contact web 300 faces the first soldering surface 611 at the top side 610 of the printed circuit board 600. The second inner side surface 430 with the second lateral soldering contact surface 431 of the second contact web 400 faces the second soldering surface 612 at the top side 610 of the printed circuit board 600.

Between the first lateral soldering contact surface 331 of the first contact web 300 of the optoelectronic component 100 and the first soldering surface 611 of the printed circuit board 600 there is a first soldering connection. Between the second lateral soldering contact surface 431 of the optoelectronic component 100 and the second soldering surface 612 of the printed circuit board 600 there is a second soldering connection. Preferably, a solder 613 in the region of the first soldering connection does not merely cover a portion of the first lateral soldering contact surface 331 of the optoelectronic component 100, but also portions of the first outer end side 350 and/or of the first outer top side 310 and/or of the first outer underside 320 with the first lower soldering contact surface 321 of the optoelectronic component 100. As a result, the first soldering connection can have a high mechanical stability and a low electrical resistance. Accordingly, in the region of the second soldering connection, too, a solder 613 preferably covers not only a portion of the second lateral soldering contact surface 431 at the second inner side surface 430 of the optoelectronic component 100, but also portions of the second outer end side 460 and/or of the second outer top side 410 and/or of the second outer underside 420 with the second lower soldering contact surface 421 of the optoelectronic component 100.

In the arrangement of the optoelectronic component 100 in the region of the cutout 630 of the printed circuit board 600 of the first electronic device 110, as shown in FIG. 2, the structural space required for the optoelectronic component 100 above the top side 610 of the printed circuit board 600 and below the underside 620 of the printed circuit board 600 is particularly small since the thickness of the printed circuit board 600 between the top side 610 thereof and the underside 620 thereof is utilized in the region of the cutout 630. As a result, the first electronic device 110 can be formed with particularly compact dimensions.

Figure 3:
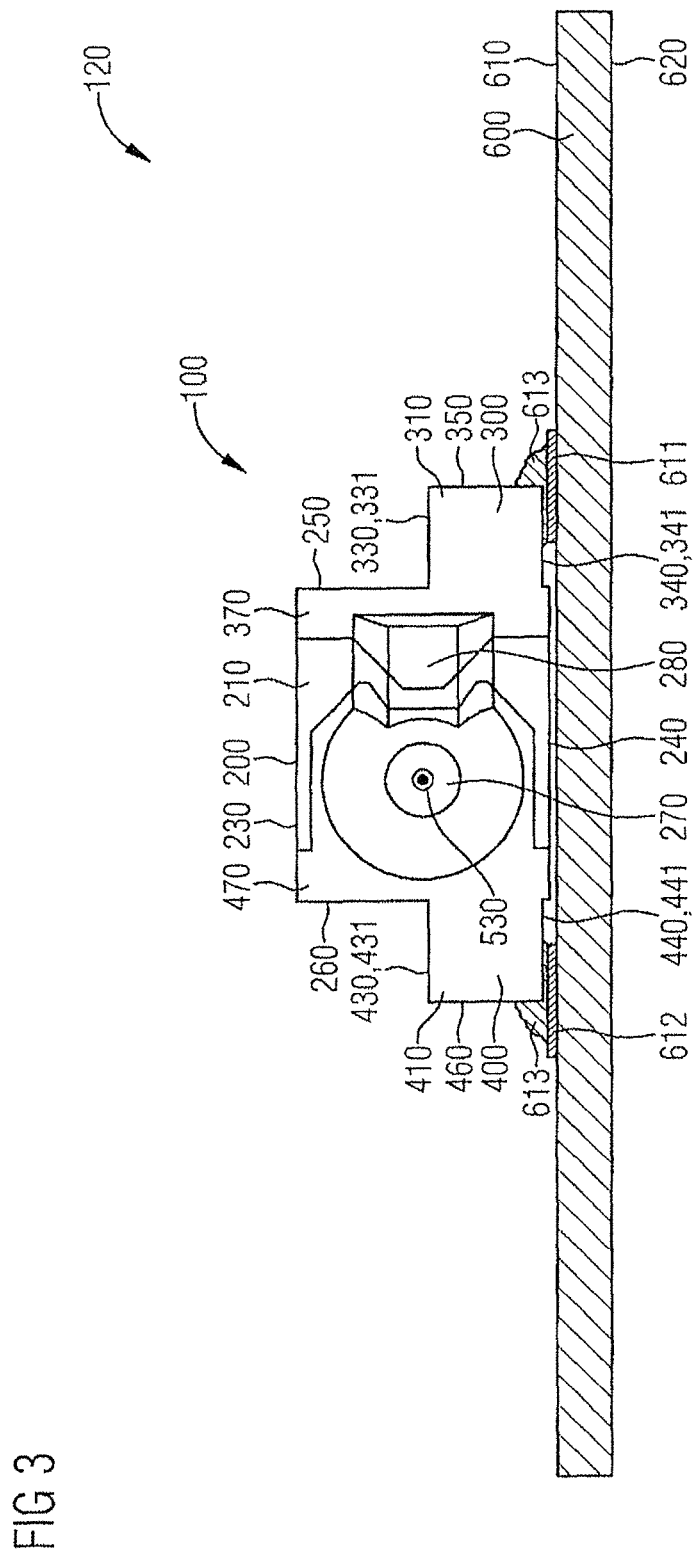
FIG. 3 shows a side view of a second electronic device including the optoelectronic component in a second arrangement.

FIG. 3 shows a slightly schematic illustration of a second electronic device 120. Not all components of the second electronic device 120 are illustrated either.

The second electronic device 120 comprises a printed circuit board 600 having a top side 610 and an underside 620 opposite the top side 610. A first soldering surface 611 and a second soldering surface 612 are arranged at the top side 610 of the printed circuit board 600. However, the printed circuit board 600 has no cutout.

The optoelectronic component 100 from FIG. 1 is arranged in a side view arrangement above the top side 610 of the printed circuit board 600. The emission direction 530 of the optoelectronic semiconductor chip 500 (not illustrated in FIG. 3) of the optoelectronic component 100 is oriented parallel to the top side 610 of the printed circuit board 600 of the second electronic device 120. The second side surface 240 of the housing 200, the first outer side surface 340 of the first contact web 300 and the second outer side surface 440 of the second contact web 400 of the housing 200 of the optoelectronic component 100 face the top side 610 of the printed circuit board 600. Between the first outer soldering contact surface 341 at the first outer side surface 340 of the first contact web 300 and the first soldering surface 611 of the printed circuit board 600 there is a first soldering connection. Between the second outer soldering contact surface 441 of the second outer side surface 440 of the second contact web 400 and the second soldering surface 612 of the printed circuit board 600 there is a second soldering connection. Preferably, a solder 613 in the region of the first soldering connection covers not only a portion of the first outer soldering contact surface 341 at the first outer side surface 340 of the first contact web 340, but also a portion of the first outer end side 350 and/or a portion of the first outer top side 310 and/or a portion of the first lower soldering contact surface 321 at the first outer underside 320 of the first contact web 300. Moreover, a solder 613 in the region of the second soldering connection preferably covers not only a portion of the second outer soldering contact surface 441 at the second outer side surface 440 of the second contact web 400, but also portions of the second outer end side 460 and/or of the second outer top side 410 and/or of the second lower soldering contact surface 421 at the second outer underside 420 of the second contact web 400 of the optoelectronic component 100. As a result, the soldering connections can once again have a high mechanical robustness and low electrical resistances.

Figure 4:
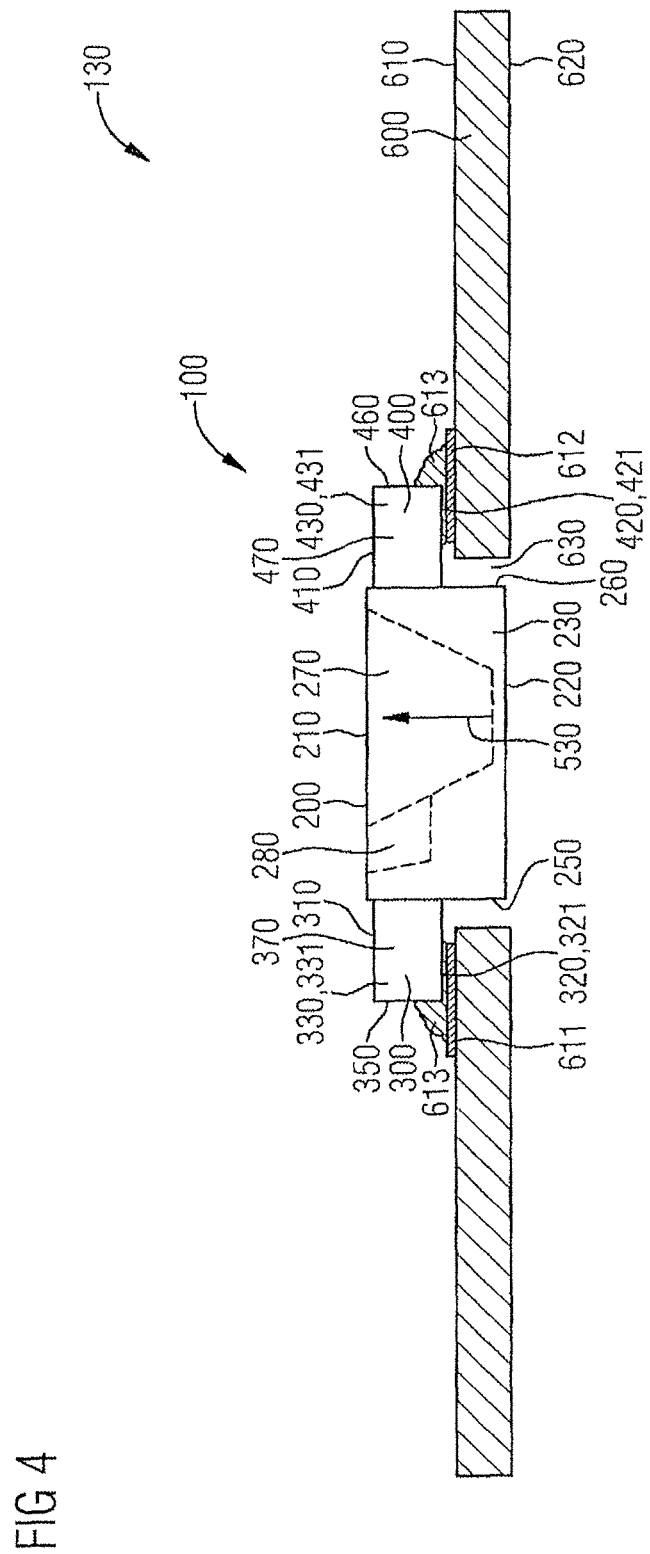
FIG. 4 shows a side view of a third electronic device including the optoelectronic component in a third arrangement.

FIG. 4 shows a schematic illustration of parts of a third electronic device 130. The third electronic device 130, too, can be an electronic device having compact outer dimensions and limited internal structural space.

The third electronic device 130 comprises a printed circuit board 600—illustrated in sectional side view—having a top side 610 and an underside 620 opposite the top side 610. The printed circuit board 600 has a cutout 630, which is formed as a perforation between the top side 610 and the underside 620. At the top side 610 of the printed circuit board 600, a first soldering surface 611 and a second soldering surface 612 are arranged on both sides of the cutout 630.

The optoelectronic component 100 from FIG. 1 is arranged in the region of the cutout 630 of the printed circuit board 600 of the third electronic device 130 in a top view arrangement. The emission direction 530 of the optoelectronic semiconductor chip 500 (not visible in FIG. 4) of the optoelectronic component 100 is oriented perpendicularly to the top side 610 of the printed circuit board 600 and faces in the same spatial direction as the top side 610 of the printed circuit board 600.

The top side 210 of the housing 200 of the optoelectronic component 100 is oriented parallel to the top side 610 of the printed circuit board 600 and is arranged above the top side 610 of the printed circuit board 600. The underside 220 of the housing 200 of the optoelectronic component 100 is arranged below the top side 610 of the printed circuit board 600. The substantially parallelepipedal main body of the housing 200 of the optoelectronic component 100 is arranged in the region of the cutout 630 of the printed circuit board 600 such that the first end side 250 and the second end side 260 of the housing 200 each face side edges of the cutout 630. As a result, the thickness of the printed circuit board 600 between the top side 610 thereof and the underside 620 thereof is utilized, thus resulting in a particularly space-saving arrangement of the optoelectronic component 100, in which a required structural space above the top side 610 and below the underside 620 of the printed circuit board 600 is particularly small.

The first contact web 300 of the optoelectronic component 100 and the second contact web 400 of the optoelectronic component 100 are supported outside the cutout 630 at the top side 610 of the printed circuit board 600 such that the first outer underside 320 of the first contact web 300 and the second outer underside 420 of the second contact web 400 face the top side 610 of the printed circuit board 600. Between the first lower soldering contact surface 321 at the first outer underside 320 of the first contact web 300 and the first soldering surface 611 of the printed circuit board 600 there is a first soldering connection. Between the second lower soldering contact surface 421 at the second outer underside 420 of the second contact web 400 and the second soldering surface 612 of the printed circuit board 600 there is a second soldering connection. Once again, solder 613 of the first soldering connection, besides a portion of the first lower soldering contact surface 321, preferably also covers portions of the first outer end side 350 and/or of the first lateral soldering contact surface 331 at the first inner side surface 330 and/or the first outer soldering contact surface 341 of the first outer side surface 340 of the first contact web 300. Correspondingly, solder 613 of the second soldering connection, besides portions of the second lower soldering contact surface 421 at the second outer underside 420 of the second contact web 400, also covers portions of the second outer end side 460 and/or of the second lateral soldering contact surface 431 at the second inner side surface 430 and/or the second outer soldering contact surface 441 of the second outer side surface 440 of the second contact web 400.

It is possible to form the first contact web 300 and the second contact web 400 of the housing 200 of the optoelectronic component 100 with a width 351 that corresponds to the width 251 of the end sides 250, 260 of the housing 200. In this case, the contact webs 300, 400 extend in the transverse direction 20 over the entire end sides 250, 260 of the housing 200. The optoelectronic component 100 can then be arranged in a side view arrangement only above a top side 610 of a printed circuit board 600. In a top view arrangement, however, as shown in FIG. 4, it can be arranged in a cutout 630 of a printed circuit board 600.

Furthermore, it is also possible to form the first contact web 300 and the second contact web 400 of the housing 200 of the optoelectronic component 100 in each case with a height 352 that corresponds to the height 252 of the end sides 250, 260 of the housing 200 of the optoelectronic component 100. The contact webs 300, 400 then extend in the upward direction 10 over the entire end sides 250, 260 of the housing 200. The optoelectronic component 100 can then be arranged in a side view arrangement in a cutout 630 of a printed circuit board 600, as is shown in FIG. 2, or can be arranged above a top side 610 of a printed circuit board 600, as is shown in FIG. 3. In a top view arrangement, the optoelectronic component can likewise be arranged above a top side 610 of a printed circuit board 600.

Our components and devices have been illustrated and described in greater detail on the basis of preferred examples. Nevertheless, the disclosure is not restricted to the disclosed examples. Rather, other variations can be derived therefrom by those skilled in the art, without departing from the scope of protection of the appended claims.

The invention claimed is:

1. An optoelectronic component comprising a housing having a top side, an underside, a first end side, a second end side and an outer surface,
   wherein the housing has a chip receptacle space at the top side, an optoelectronic semiconductor chip arranged in said chip receptacle space,
   the first end side and the second end side each extend in an upward direction between the underside and the top side,
   a protruding first contact web is formed at the first end side and a protruding second contact web is formed at the second end side,
   the first contact web and the second contact web, in a transverse direction oriented perpendicularly to the upward direction, have a smaller width than the first end side and the second end side,
   the housing has a first soldering contact surface, a second soldering contact surface, a third soldering contact surface and a fourth soldering contact surface,
   the first soldering contact surface and the second soldering contact surface face in a same spatial direction as the outer surface,
   the first soldering contact surface and the second soldering contact surface are set back relative to the outer surface,
   the third soldering contact surface and the fourth soldering contact surface face in the same spatial direction as the underside,
   the third soldering contact surface and the fourth soldering contact surface are set back relative to the underside,
   the first soldering contact surface is formed by a first metalization arranged at the first contact web at the surface of the housing,
   the second soldering contact surface is formed by a second metalization arranged at the second contact web at the surface of the housing, and
   the housing comprises an electrically insulating plastic material and is coated with the metalizations in sections.

2. The optoelectronic component as claimed in claim 1, wherein the optoelectronic semiconductor chip electrically conductively connects to the first metalization by a bonding wire.

3. The optoelectronic component as claimed in claim 1, wherein the second metalization forms an optical reflector in the region of the chip receptacle space.

4. The optoelectronic component as claimed in claim 1, wherein the first contact web and the second contact web are arranged at the first end side and the second end side in an uncentered fashion in the transverse direction.

5. The optoelectronic component as claimed in claim 1, wherein the first contact web and the second contact web are at most half as wide as the first end side and the second end side in the transverse direction.

6. The optoelectronic component as claimed in claim 1, wherein the first metalization extends over all outer surfaces of the first contact web and/or the second metalization extends over all outer surfaces of the second contact web.

7. The optoelectronic component as claimed in claim 1, wherein the chip receptacle space is formed as a substantially funnel-shaped depression.

8. The optoelectronic component as claimed in claim 1, wherein the first contact web and the second contact web have a smaller height in the upward direction than the first end side and the second end side, and
the third soldering contact surface is formed at the first contact web and the fourth soldering contact surface is formed at the second contact web.

9. The optoelectronic component as claimed in claim 8, wherein the first contact web and the second contact web are arranged at the first end side and the second end side in an uncentered fashion in the upward direction.

10. The optoelectronic component as claimed in claim 8, wherein the first contact web and the second contact web are at most half as high as the first end side and the second end side in the upward direction.

11. An electronic device comprising a printed circuit board having a cutout, wherein an optoelectronic component as claimed in claim 1 is arranged in the cutout.

\* \* \* \* \*